(12) United States Patent
Yang

(10) Patent No.: US 11,016,847 B2
(45) Date of Patent: *May 25, 2021

(54) MEMORY SYSTEM AND OPERATION METHOD THEREOF

(71) Applicant: SK hynix Inc., Gyeonggi-do (KR)

(72) Inventor: Chan-Woo Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/577,681

(22) Filed: Sep. 20, 2019

(65) Prior Publication Data
US 2020/0012563 A1 Jan. 9, 2020

Related U.S. Application Data

(63) Continuation of application No. 15/703,133, filed on Sep. 13, 2017, now Pat. No. 10,423,485.

(30) Foreign Application Priority Data

Jan. 17, 2017 (KR) .......................... 10-2017-0007976

(51) Int. Cl.
| | |
|---|---|
| *G06F 11/10* | (2006.01) |
| *G11C 29/52* | (2006.01) |
| *G11C 29/00* | (2006.01) |
| *G11C 29/44* | (2006.01) |
| *G11C 29/04* | (2006.01) |

(52) U.S. Cl.
CPC ...... *G06F 11/1068* (2013.01); *G06F 11/1048* (2013.01); *G11C 29/52* (2013.01); *G11C 29/883* (2013.01); *G11C 29/44* (2013.01); *G11C 2029/0409* (2013.01); *G11C 2029/0411* (2013.01)

(58) Field of Classification Search
CPC .. G06F 11/1068; G06F 11/1048; G11C 29/52; G11C 29/883; G11C 29/44; G11C 2029/0409; G11C 2029/0411
USPC ................ 714/764, 746, 763, 765, 773, 799
See application file for complete search history.

(56) References Cited

U.S. PATENT DOCUMENTS

| | | | | |
|---|---|---|---|---|
| 5,862,263 A | * | 1/1999 | Kim ....................... | H04N 19/99 382/249 |
| 8,689,081 B2 | * | 4/2014 | Yu ....................... | G06F 11/1048 714/764 |
| 9,471,509 B2 | * | 10/2016 | Mukherjee ......... | G06F 9/45558 |
| 9,507,726 B2 | * | 11/2016 | Kumar ............... | G06F 12/1027 |
| 9,563,571 B2 | * | 2/2017 | Kumar ............... | G06F 12/1027 |
| 9,847,141 B1 | * | 12/2017 | Sagiv .................. | G11C 29/028 |
| 10,157,096 B2 | * | 12/2018 | Cai ..................... | G06F 11/1048 |
| 2009/0282308 A1 | * | 11/2009 | Gutsche ............. | G06F 11/1048 714/746 |

(Continued)

*Primary Examiner* — John J Tabone, Jr.

(74) *Attorney, Agent, or Firm* — IP & T Group LLP

(57) ABSTRACT

A memory system may include: a nonvolatile memory device comprising a plurality of memory blocks; and a controller suitable for checking a read operation time, a read level class, an error occurrence, and an error occurrence class when performing the read operation on each of the memory blocks, classifying the memory blocks into various classes based on a result of the checking, and differently setting a durability parameter for each of the memory blocks based on a result of the classifying of the memory blocks.

20 Claims, 10 Drawing Sheets

(56) References Cited

U.S. PATENT DOCUMENTS

| | | | |
|---|---|---|---|
| 2012/0113720 A1* | 5/2012 | Kim | G11C 16/3409 |
| | | | 365/185.11 |
| 2012/0137104 A1* | 5/2012 | Fan | G11C 29/44 |
| | | | 711/173 |
| 2012/0173920 A1* | 7/2012 | Park | G11C 29/82 |
| | | | 714/6.11 |
| 2012/0246540 A1* | 9/2012 | Lee | G06F 12/0246 |
| | | | 714/758 |
| 2015/0074367 A1* | 3/2015 | Cher | G06F 11/3058 |
| | | | 711/165 |
| 2015/0178149 A1* | 6/2015 | Cai | G06F 11/108 |
| | | | 714/766 |
| 2015/0227418 A1* | 8/2015 | Cai | G06F 11/1048 |
| | | | 714/768 |
| 2015/0309940 A1* | 10/2015 | Kumar | G06F 12/1045 |
| | | | 345/506 |
| 2015/0310580 A1* | 10/2015 | Kumar | G06F 12/1027 |
| | | | 345/502 |
| 2016/0049204 A1* | 2/2016 | Watanabe | G11C 11/5642 |
| | | | 714/764 |
| 2016/0275016 A1* | 9/2016 | Mukherjee | G06F 9/45558 |
| 2017/0060743 A1* | 3/2017 | Kumar | G06F 12/1009 |
| 2017/0160934 A1* | 6/2017 | Park | G06F 3/0614 |
| 2017/0177425 A1* | 6/2017 | Jei | G06F 11/1072 |
| 2018/0182467 A1* | 6/2018 | Kang | G11C 29/80 |

* cited by examiner

MEMORY SYSTEM AND OPERATION METHOD THEREOF

CROSS-REFERENCE TO RELATED APPLICATION

This application is a continuation of U.S. patent application Ser. No. 15/703,133 filed on Sep. 13, 2017, which claims benefits of priority of Korean Patent Application No. 10-2017-0007976 filed on Jan. 17, 2017. The disclosure of each of the foregoing application is incorporated herein by reference in its entirety.

BACKGROUND

1. Field

Exemplary embodiments of the present invention relate to a memory system including a nonvolatile memory device and an operating method of the memory system.

2. Description of the Related Art

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Various embodiments are directed to a memory system employing a nonvolatile memory device and an operating method of the memory system. The memory system is capable of categorizing the memory bocks of the nonvolatile memory device in a plurality of classes based on durability criteria and determining the future use of the memory blocks based on the classification. This is advantageous because it may significantly improve the operational stability of the memory system. The memory system may check a plurality of durability criteria for each of the plurality of memory blocks and may categorize the memory blocks based on the checked criteria. The durability criteria may be set different for each memory block.

In an embodiment, a memory system may include: a nonvolatile memory device comprising a plurality of memory blocks; and a controller suitable for checking a read operation time, a read level class, an error occurrence, and an error occurrence class when performing the read operation on each of the memory blocks, classifying the memory blocks into various classes based on a result of the checking, and differently setting a durability parameter for each of the memory blocks based on a result of the classifying of the memory blocks.

Among the memory blocks, the controller may classify a target memory block having a number of program/erase cycles number equal to or smaller than a PE cycle threshold as a first group memory block while classifying the target memory block having a number of PE cycles greater than the PE cycle threshold as a second group memory block.

Among a plurality of the first group memory blocks, the controller may further classify a target memory block, a read operation to which successes with first class read levels, as a first class memory block, and the first class read levels may be K numbers of read levels among predetermined N read levels.

Among the first group memory blocks, the controller may further suspend classification of a target memory block, a read operation to which is successful with second class read levels, among remaining memory blocks other than the first class memory blocks, the second class read levels may be remaining read levels other than the first class read levels among the predetermined N read levels. Among previously classification-suspended memory blocks, the controller may further classify the second group memory block also as the first class memory block.

The memory system may further include an ECC unit suitable for performing an error-correction operation to a target memory block of the read operation to the respective memory blocks. Among the first group memory blocks other than the first class memory blocks and the classification-suspended memory blocks, the controller may further classify a target memory block as one of second and third class memory blocks and an unavailable memory block according to a result of the error-correction operation to the target memory block.

The error-correction operation may include a hard decoding operation and a soft decoding operation. Among the first group memory blocks other than the first class memory blocks and the classification-suspended memory blocks, the controller may classify as the second class memory block a target memory block, a success number of the hard decoding operations to which reaches a predetermined threshold for second class memory block.

Among the first group memory blocks other than the first class memory blocks, the classification-suspended memory blocks and the second class memory blocks, the controller may classify as the third class memory block a target memory block, a success number of the soft decoding operations to which reaches a predetermined threshold for third class memory block, and may classify one or more respective remaining memory blocks as the unavailable memory block.

The durability parameter may include a read reclaim count reference number and a PE cycle limit number for the respective memory blocks, the controller may set the durability parameter such that the respective second class memory blocks has one of the read reclaim count reference number and the PE cycle limit number less than that of the first class memory blocks, and the controller may set the durability parameter such that the respective third class memory blocks has both of the read reclaim count reference number and the PE cycle limit number less than those of the second class memory blocks.

The respective memory blocks may include a memory cell capable of storing two or more bits, the controller may set the durability parameter such that the respective second class memory blocks has the read reclaim count reference number less than that of the first class memory blocks during a read operation to the second memory blocks with a predetermined first read level, and the controller may set the durability parameter such that the respective second class memory blocks has the PE cycle limit number less than that of the first class memory blocks during a read operation to the second memory blocks with one or more predetermined second read levels higher than the predetermined first read level.

The controller may set the durability parameter such that the respective third class memory blocks has both of the read reclaim count reference number and the PE cycle limit number less than those of the second class memory blocks during a read operation to the third memory blocks with the predetermined first and second read levels.

In an embodiment, an operating method of a memory system comprising a plurality of memory blocks, the operating method may include: checking a read operation time, a read level class, an error occurrence, and an error occurrence class when performing the read operation on each of the memory blocks; classifying, the memory blocks into various classes based on a result of the checking; and differently setting a durability parameter for each of the memory blocks based on a result of the classifying of the memory blocks.

The classifying of the memory blocks may include classifying, among the memory blocks, a target memory block having a number of program/erase cycles number equal to or smaller than a PE cycle threshold as a first group memory block while classifying the target memory block having a number of PE cycles greater than the PE cycle threshold as a second group memory block.

The classifying of the memory blocks may further include classifying, among a plurality of the first group memory blocks, a target memory block, a read operation to which successes with first class read levels, as a first class memory block, and the first class read levels may be K numbers of read levels among predetermined N read levels.

The classifying of the memory blocks may further include suspending, among the first group memory blocks, classification of a target memory block, a read operation to which is successful with second class read levels, among remaining memory blocks other than the first class memory blocks, the second class read levels may be remaining read levels other than the first class read levels among the predetermined N read levels, and the classifying of the memory blocks may further include classifying, among previously classification-suspended memory blocks, the second group memory block also as the first class memory block.

The classifying of the memory blocks may further include classifying, among the first group memory blocks other than the first class memory blocks and the classification-suspended memory blocks, a target memory block as one of second and third class memory blocks and an unavailable memory block according to a result of error-correction operation to the target memory block.

The error-correction operation may include a hard decoding operation and a soft decoding operation, and the classifying of the target memory block as one of second and third class memory blocks and an unavailable memory block may include classifying, among the first group memory blocks other than the first class memory blocks and the classification-suspended memory blocks, as the second class memory block a target memory block, a success number of the hard decoding operations to which reaches a predetermined threshold for second class memory block.

The classifying of the target memory block as one of second and third class memory blocks and an unavailable memory block may further include classifying, among the first group memory blocks other than the first class memory blocks, the classification-suspended memory blocks and the second class memory blocks, as the third class memory block a target memory block, a success number of the soft decoding operations to which reaches a predetermined threshold for third class memory block, and classifying one or more respective remaining memory blocks as the unavailable memory block.

The durability parameter may include a read reclaim count reference number and a PE cycle limit number for the respective memory blocks, and the differently setting of the durability parameter may be performed such that the respective second class memory blocks has one of the read reclaim count reference number and the PE cycle limit number less than that of the first class memory blocks, and such that the respective third class memory blocks has both of the read reclaim count reference number and the PE cycle limit number less than those of the second class memory blocks.

The respective memory blocks may include a memory cell of two or more bits, the differently setting of the durability parameter may be performed such that the respective second class memory blocks has the read reclaim count reference number less than that of the first class memory blocks during a read operation to the second memory blocks with a predetermined first read level, and such that the respective second class memory blocks has the PE cycle limit number less than that of the first class memory blocks during a read operation to the second memory blocks with one or more predetermined second read levels higher than the predetermined first read level.

The differently setting of the durability parameter may be performed such that the respective third class memory blocks has both of the read reclaim count reference number and the PE cycle limit number less than those of the second class memory blocks during a read operation to the third memory blocks with the predetermined first and second read levels.

BRIEF DESCRIPTION OF THE DRAWINGS

These and other features and advantages of the present invention will become apparent to those skilled in the art to which the present invention pertains from the following detailed description in reference to the accompanying drawings, wherein.

DETAILED DESCRIPTION

Figure 1:
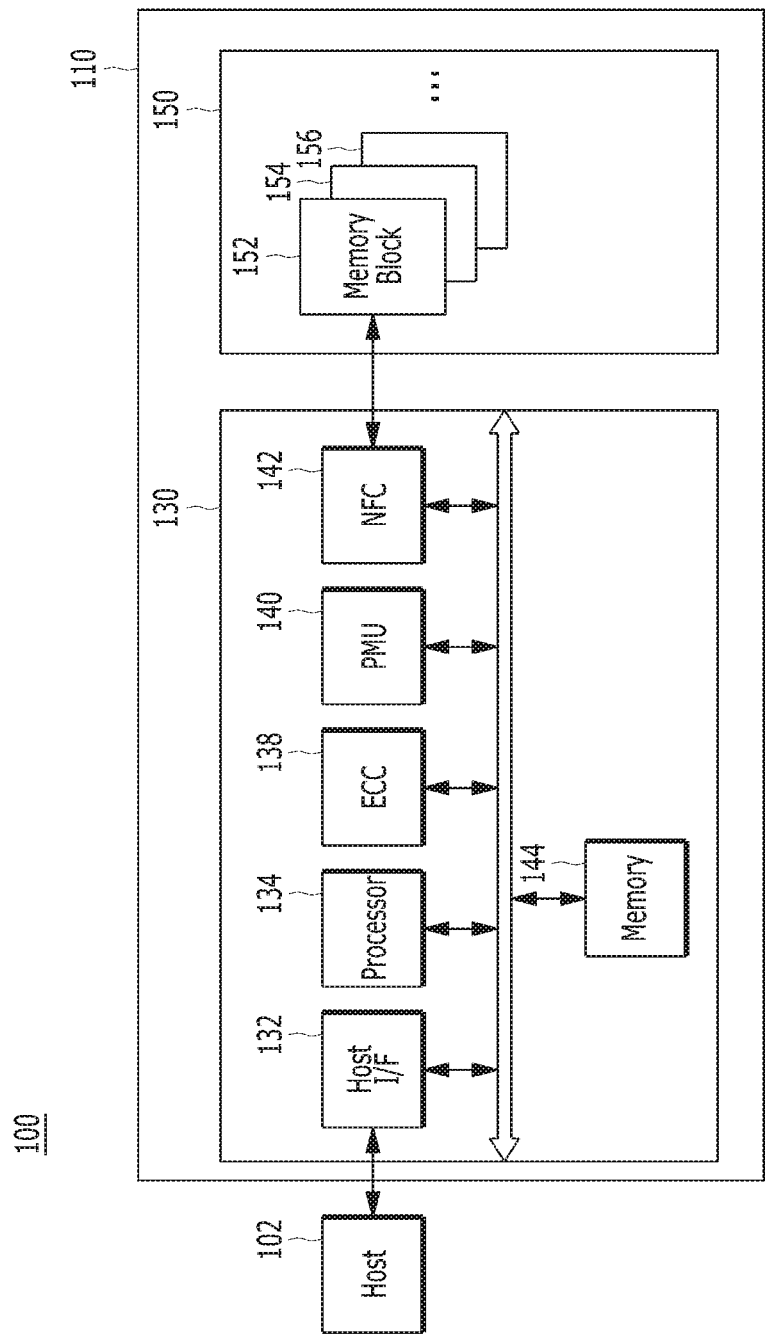
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 and a memory system 110.

The host 102 may include portable electronic devices such as a mobile phone, MP3 player and laptop computer or non-portable electronic devices such as a desktop computer, game machine, TV and projector.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
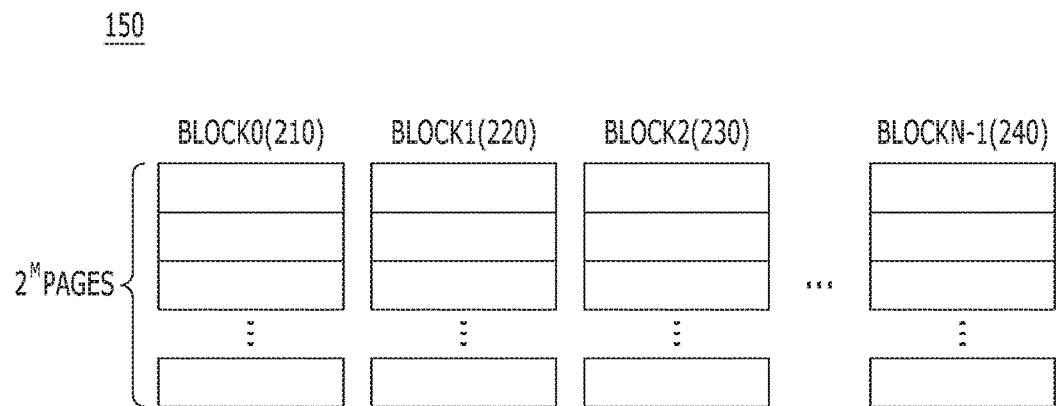
FIG. 2 is a schematic diagram illustrating an exemplary configuration of a memory device employed in the memory system shown in FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data, and so forth.

Figure 3:
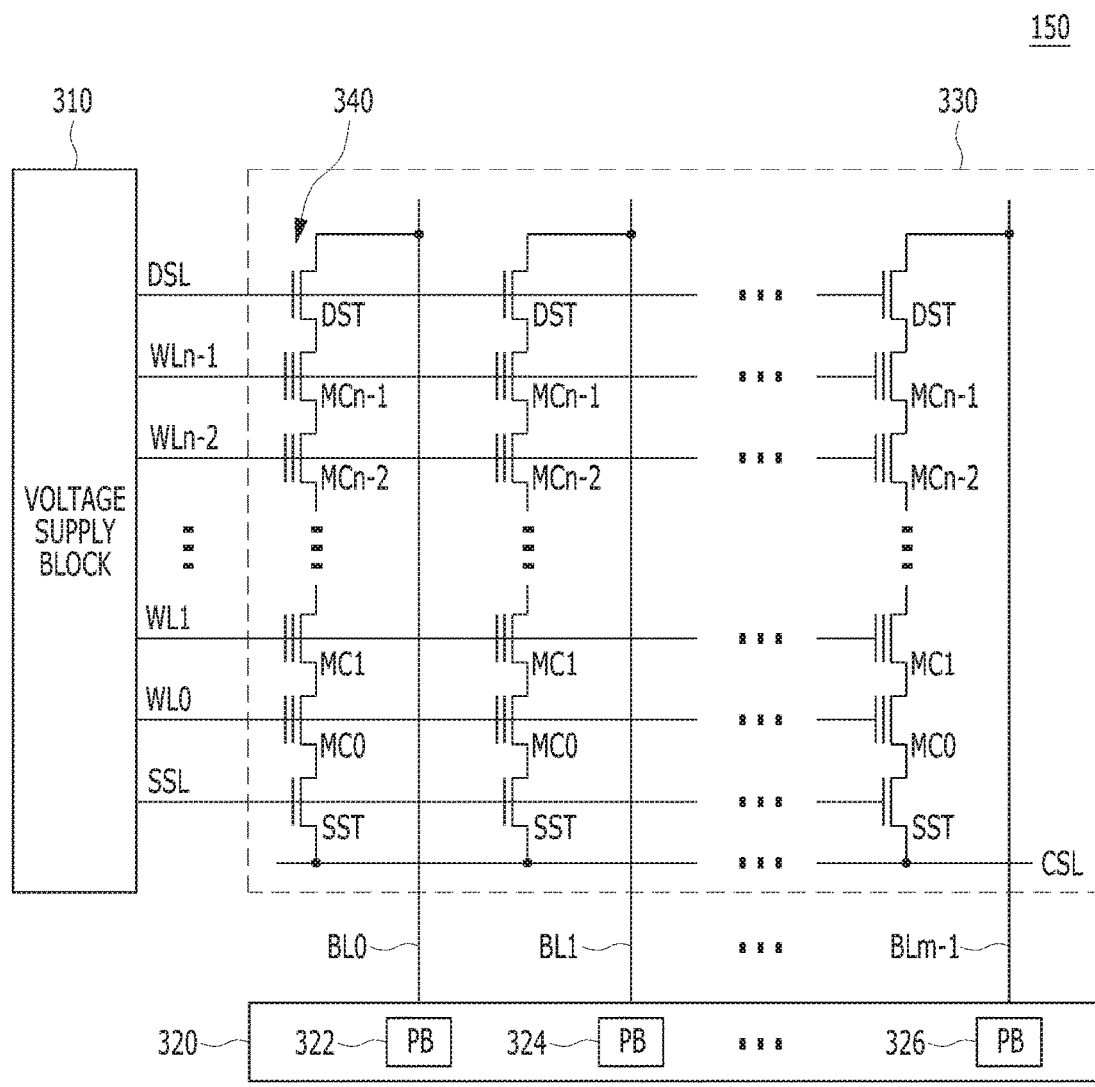
FIG. 3 is a circuit diagram illustrating an exemplary configuration of a memory cell array of a memory block in the memory device shown in FIG. 2.

FIG. 3 is a circuit diagram illustrating a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
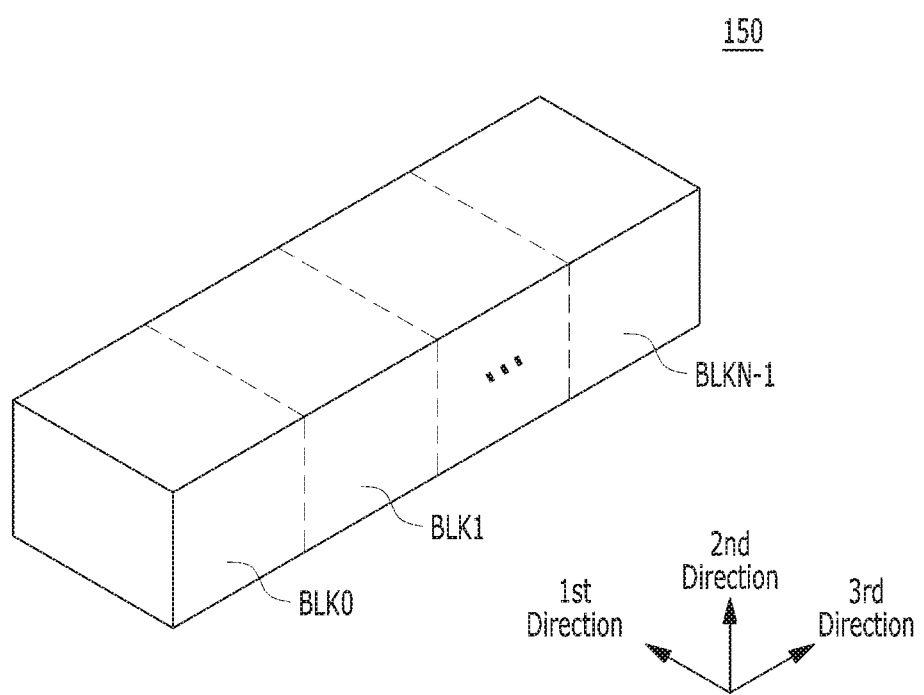
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each of the memory blocks having a 3D structure (or vertical structure).

Figure 5:
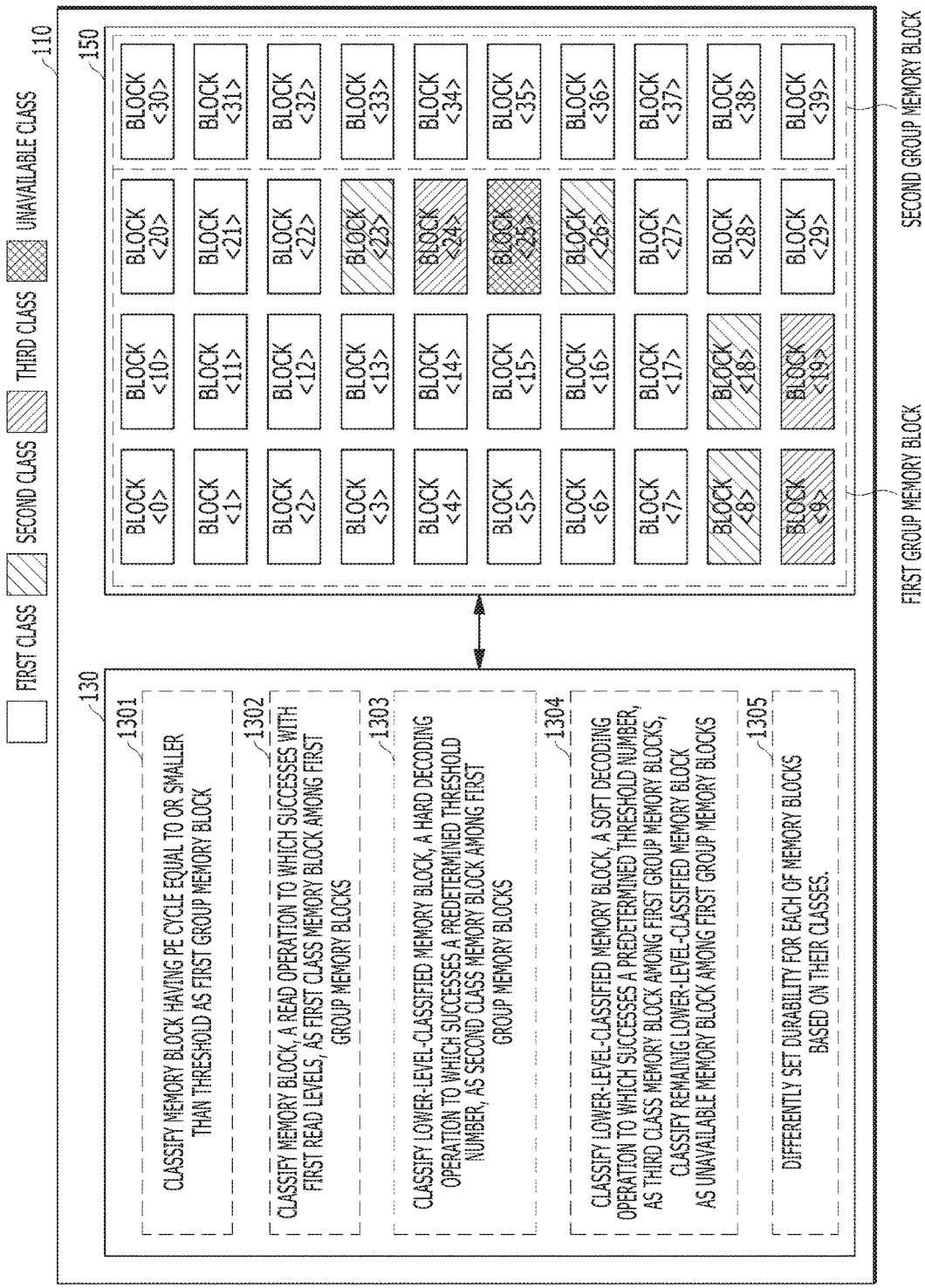
FIG. 5 is a block diagram illustrating a memory system shown in FIGS. 1 to 4.

FIG. 5 is a block diagram illustrating the memory system 110.

FIG. 5 illustrates the memory system 110 associated with the embodiment of the present invention. The memory system 110 may include the controller 130 and the memory device 150 as described with reference to FIGS. 1 to 4. The memory device 150 may exemplarily include a plurality of memory blocks BLOCK<0:39>. FIG. 5 discloses an exemplary configuration in which a single nonvolatile memory device 150 has been included in the memory system 110, however, it is noted that this is only an example. A larger number of nonvolatile memory devices may be included in the memory system 110. Furthermore, FIG. 5 discloses an exemplary configuration in which 40 memory blocks BLOCK<0:39> have been included in the memory device 150, however, it is noted this is also only an example, and that a larger number of memory blocks may be included in the memory device 150. Furthermore, the host interface (I/F) 132, the processor 134, the ECC unit 138, the power management unit 140, the NAND flash controller (NFC) 142 and the memory 144, which have been illustrated as being included in the controller 130 in FIG. 1, are not illustrated in the controller 130 of FIG. 5 for convenience of description. Hence, it should be understood, that the controller 130 of FIG. 5 may also include the elements of the controller 130 shown in FIG. 1.

During a read operation to each of the memory blocks BLOCK<0:39>, the controller 130 may classify the respective memory blocks BLOCK<0:39> into various classes for a read operation based on a durability status of the respective memory blocks BLOCK<0:39>, and may set a durability parameter differently for each of the memory blocks BLOCK<0:39> based on the classification. More specifically, when performing a read operation on each of the memory blocks BLOCK<0:39>, the controller 130 may check the durability status of a memory block by checking a read operation time, a read level class, whether an error is generated or not and an error occurrence class. The controller 130 may then classify the memory blocks BLOCK<0:39> into respective operation classes based on the result of the check, and may set a durability criterion differently for each of the memory blocks BLOCK<0:39> based on the classification.

During a read operation to each of the memory blocks BLOCK<0:39>, the controller 130 classifies a memory block having a number of program/erase (PE) cycles equal to or smaller than a PE cycle threshold as a first group memory block (1301), and a memory block having a number of PE cycles greater than the PE cycle threshold as a second group memory block. For example, in an embodiment, the PE cycle threshold of a memory block may be 10% (e.g., 300) of a predefined maximum number of PE cycles (e.g., 3000) of the memory block.

In the illustrated example, it is assumed that 30 memory blocks BLOCK<0:29> of the 40 memory blocks BLOCK<0:39> are classified as the first group memory blocks BLOCK<0:29> and the remaining 10 memory blocks BLOCK<30:39> are classified as the second group memory blocks BLOCK<30:39>.

The controller 130 uses a specific read level to read codeword from the respective memory blocks BLOCK<0:39>. For example, the specific read level may be predefined through a read retry table (RRT). The RRT may be predetermined in a process of designing and producing the nonvolatile memory device 150. The RRT defines various read levels (for example, N read levels) which may be used for retrying a read operation. Specifically, when a read operation to each of the memory blocks BLOCK<0:39> fails with a read level, then the read operation may be retried, after changing the read level to a new level which is selected from the read levels of the RRT. Any suitable read retry table and operation may be employed. Since, read retry operations and RRTs are well-known in the art, further description thereof is omitted.

Furthermore, the controller 130 may set K optimal read levels among the N read levels of the RRT to perform a read operation on each of the memory blocks BLOCK<0:39>. Here, the K optimal levels may be setting in a process of designing and producing the nonvolatile memory device 150. That is, in a process of designing and producing the nonvolatile memory device 150, there may be a memory block that belongs to the memory blocks BLOCK<0:39> and that has a relatively better state and a memory block that belongs to the memory blocks BLOCK<0:39> and that has a relatively poorer state. In this case, the K read levels of the N read levels included in the RRT may be set as criteria for distinguishing the memory block having a relatively better state from the memory block having a relatively poorer state.

Among the N read levels in the RRT, the K optimal read levels may be classified as first class read levels and the others as second class read levels.

Among the first group memory blocks BLOCK<0:29>, the controller 130 classifies a memory block, a read operation to which succeeds with a first class read level, as a first class memory block (1302).

For example, the controller 130 may classify 10 read levels as the first class read levels among 50 read levels of the RRT. Among the first group memory blocks BLOCK<0:29>, the controller 130 classifies a memory block, a read operation to which succeeds with the 10 first class read levels, as the first class memory block. FIG. 5 exemplifies 22 memory blocks BLOCK<0:7, 10:17, 20:22, 27:29> classified as the first class memory blocks among the 30 first group memory blocks BLOCK<0:29>.

The classification of the first group memory blocks (i.e., memory blocks BLOCK<0:29> in the above-described example) may be performed at each PE cycle of the respective memory blocks BLOCK<0:39>. The classification of the first class memory blocks (i.e., the memory blocks BLOCK<0:7, 10:17, 20:22, 27:29> in the above-described example) may be performed at each read operation to the respective first group memory blocks BLOCK<0:29> with the K (i.e., 10 in the above-described example) first class read levels.

Among the first group memory blocks BLOCK<0:29>, the read operation to some memory blocks (hereinafter, referred to as classification-suspended memory blocks) of the remaining memory blocks BLOCK<8:9, 18:19, 23:26> other than the first class memory blocks BLOCK<0:7, 10:17, 20:22, 27:29> may be successful with the second class read levels. On the other hand, among the first group memory blocks BLOCK<0:29>, data read from the other memory blocks (hereinafter, referred to as lower-level-classified memory blocks) of the remaining memory blocks BLOCK<8:9, 18:19, 23:26> other than the first class memory blocks BLOCK<0:7, 10:17, 20:22, 27:29> may not be successful during the read operation thereto with the second class read level. The controller 130 may control the ECC unit 138 to perform the error-detection operation to data read from the memory blocks BLOCK<0:39> during the read operation thereto.

At a time when the controller 130 classifies the classification-suspended memory block as the second group memory block as the number of PE cycles of the respective first group memory blocks becomes greater, the controller 130 may also classify the classification-suspended memory block as the first class memory block. For example, as assumed in FIG. 5, the controller 130 may classify the 10 memory blocks BLOCK<30:39> as the second group memory blocks. If there is the classification-suspended memory block among the 10 memory blocks BLOCK<30:39> classified as the second group memory block, the controller 130 may also classify the classification-suspended memory block as the first class memory block.

The controller 130 may control the ECC unit 138 to perform the error-correction operation to the respective lower-level-classified memory blocks as described with reference to FIG. 1, and may classify the respective lower-level-classified memory blocks as one of second and third class memory blocks and an unavailable memory block according to the result of the error correction operation.

The error correction operation performed by the ECC unit 138 of FIG. 1 is basically classified into a hard decoding operation and a soft decoding operation, which are well-known in the art.

Through the hard decoding operation, the ECC unit 138 may correct an error of data read from the memory block according to a smaller number of read levels than the soft decoding operation. The hard decoding operation requires a shorter time for correcting an error and has a smaller number of correctable error bits, compared to the soft decoding operation.

In accordance with an embodiment of the present invention, the controller 130 may first perform the hard decoding operation to the respective lower-level-classified memory blocks. Whenever the hard decoding operation to a particular one of the lower-level-classified memory blocks is successful, the controller 130 may increase a hard decoding recovery success count value of the particular lower-level-classified memory block, to which the hard decoding operation is successful. When the hard decoding recovery success count value of a particular lower-level-classified memory block reaches a predetermined threshold for the second class memory block, the controller 130 may classify the particular lower-level-classified memory block as a second class memory block (1303). FIG. 5 illustrates an example of memory blocks BLOCK<8, 18, 23, 26> classified as the second class memory blocks among the lower-level-classified memory blocks BLOCK<8:9, 18:19, 23:26>.

The controller 130 classifies a particular lower-level-classified memory block as the second class memory block when the hard decoding recovery success count value of the particular lower-level-classified memory block reaches the predetermined threshold for the second class memory block for preventing a lower-level-classified memory block, which should be classified as a third class memory block or an unavailable memory block, from being classified as the second class memory block due to a single or small number of success times of the hard decoding operation thereto. The single or small number of success times of the hard decoding operation may be smaller than the predetermined threshold for the second class memory block.

As described above, the controller 130 classifies a corresponding memory block second class memory block only when an operation for successfully recovering the corresponding memory block in which an error has occurred through a hard decoding operation is repeated by a predetermined number or more as a result of a read operation performed on the remaining memory blocks BLOCK<8:9, 18:19, 23:26 that belong to the first memory blocks BLOCK<0:29> and that have not been classified into the first class memory blocks BLOCK<0:7, 10:17, 20:22, 27:29> using the second class read level. The reason for this is that when the controller 130 performs the read operation on the remaining memory blocks BLOCK<8:9, 18:19, 23:26 using the second class read level, a temporary error which can be corrected through the hard decoding operation may occur due to an operation environment of the memory system 110 or an unknown reason.

For example, from FIG. 5, it may be seen that four memory blocks BLOCK<8, 18, 23, 26> of the remaining memory blocks BLOCK<8:9, 18:19, 23:26 that belong to the first memory blocks BLOCK<0:29> and which have not been classified into the first class memory blocks BLOCK<0:7, 10:17, 20:22, 27:29> have been classified into the second class memory blocks. This means that when a read operation using the second class read level was repeatedly performed on the four memory blocks BLOCK<8, 18, 23, 26> of the remaining memory blocks BLOCK<8:9, 18:19, 23:26 by at least a predetermined number, an error was generated in the four memory blocks BLOCK<8, 18, 23, 26> by a predetermined number and the four memory blocks BLOCK<8, 18, 23, 26> have been recovered through a hard decoding operation by a predetermined number.

In accordance with an embodiment of the present invention, the controller 130 may perform the soft decoding operation to the lower-level-classified memory blocks, the hard decoding recovery success count values of which do not reach the predetermined threshold for the second class memory block. That is, the controller 130 may secondly perform the soft decoding operation to the lower-level-classified memory blocks other than the second class memory blocks. Whenever the soft decoding operation to a particular one of the lower-level-classified memory blocks other than the second class memory blocks is successful, the controller 130 may increase a soft decoding recovery success count value of the particular lower-level-classified memory block other than the second class memory blocks, to which the soft decoding operation is successful. When the soft decoding recovery success count value of a particular lower-level-classified memory block other than the second class memory blocks reaches a predetermined threshold for the third class memory block, the controller 130 may classify the particular lower-level-classified memory block other than the second class memory blocks as a third class memory block (1304). FIG. 5 illustrates an example of memory blocks BLOCK<9, 19, 24> classified as the third class memory blocks among the lower-level-classified memory blocks BLOCK<8:9, 18:19, 23:26> other than the second class memory blocks BLOCK<8, 18, 23, 26>.

Hence, stated otherwise, if a read operation has not been normally completed and an error of a predetermined number or more has occurred as a result of the read operation performed on the remaining memory blocks BLOCK<8:9, 18:19, 23:26 that belong to the first memory blocks BLOCK<0:29> and that have not been classified into the first class memory blocks BLOCK<0:7, 10:17, 20:22, 27:29> using the second class read level and also an attempt to recover a corresponding memory block in which an error has occurred through a hard decoding operation has been made, but has failed, the controller 130 in accordance with an embodiment of the present invention performs a soft decoding operation on the corresponding memory block for which the hard decoding operation has failed. If recovery for the corresponding memory block is successful as a result of the execution of the soft decoding operation, the controller 130 increases the soft decoding recovery success count value of the corresponding memory block, and classifies the corresponding memory block to be a third class memory block when the soft decoding recovery success count value of the corresponding memory block that has been successfully recovered through the soft decoding operation becomes a predetermined number or more (1304).

The reason why the controller 130 classifies a particular lower-level-classified memory block as the third class memory block when the soft decoding recovery success count value of the particular lower-level-classified memory block reaches the predetermined threshold for the third class memory block is to prevent a lower-level-classified memory block, which should be classified as an unavailable memory block, from being classified as the third class memory block due to mere one or small number of success times of the soft decoding operation thereto. The mere one or small number of success times of the soft decoding operation may be smaller than the predetermined threshold for the third class memory block.

For example, from FIG. 5, it may be seen that three memory blocks BLOCK<9, 19, 24> of the remaining memory blocks BLOCK<8:9, 18:19, 23:26 that belong to the first memory blocks BLOCK<0:29> and that have not been classified into the first class memory blocks BLOCK<0:7, 10:17, 20:22, 27:29> have been classified into the third class memory blocks. This means that when the read operation was repeatedly performed on the three memory blocks BLOCK<9, 19, 24> of the remaining memory blocks BLOCK<8:9, 18:19, 23:26 by the at least predetermined number using the second class read level, an error was generated in the three memory blocks BLOCK<9, 19, 24> by a predetermined number, a hard decoding operation for recovery was performed on the three memory blocks BLOCK<9, 19, 24> by a predetermined number, but failed and the three memory blocks BLOCK<9, 19, 24> have been recovered through a soft decoding operation performed by a predetermined number.

In accordance with an embodiment of the present invention, the controller 130 may classify as unavailable memory blocks remaining lower-level-classified memory blocks, both of the hard decoding recovery success count values and the soft decoding recovery success count values of which do not reach the predetermined thresholds for the second class memory block and for the third class memory block. That is, the controller 130 may classify as the unavailable memory blocks the remaining lower-level-classified memory blocks other than the second and third class memory blocks (1304). FIG. 5 illustrates an example of a memory block BLOCK<25> classified as the unavailable memory block among the lower-level-classified memory blocks BLOCK<8:9, 18:19, 23:26> other than the second class memory blocks BLOCK<8, 18, 23, 26> and the third class memory blocks BLOCK<9, 19, 24>.

In the future, the unavailable memory block may be used to store data, which is less reliability-sensitive, or may not be used.

The controller 130 may set a memory block that belongs to the memory blocks BLOCK<0:39> and that has been classified as an unavailable class as a complete bad block so that the corresponding memory block is not used again, or may set the corresponding memory block as an instant bad block so that data stored in the corresponding memory block is no longer used when the corresponding memory block is classified as an unavailable class, but the corresponding memory block may be used to subsequently store other data. Whether a memory block which is classified as an unavailable class is to be further classified as a complete bad block or an instant bad block may be differently determined by a user.

For example, from FIG. 5, it may be seen that one memory block BLOCK<25> of the remaining memory blocks BLOCK<8:9, 18:19, 23:26 that belong to the first memory blocks BLOCK<0:29> and that have not been classified into the first class memory blocks BLOCK<0:7, 10:17, 20:22, 27:29> has been classified as an unavailable class. This means that when a read operation using the second class read level was performed on the memory block BLOCK<25> of the remaining memory blocks BLOCK<8:9, 18:19, 23:26, an error was generated in the memory block BLOCK<25>, a hard decoding operation for recovery was performed on the memory block BLOCK<25>, but failed, and a soft decoding operation for recovery was performed on the memory block BLOCK<25>, but also failed.

To sum up, during a read operation to each of the memory blocks BLOCK<0:39>, the controller 130 may classify the memory blocks BLOCK<0:39>. The first group memory block BLOCK<0:29> may have the number of PE cycles equal to or smaller than the PE cycle threshold, while the second group memory block BLOCK<30:39> may have the number of PE cycles greater than the PE cycle threshold.

Among the first group memory blocks BLOCK<0:29>, the first class memory blocks BLOCK<0:7, 10:17, 20:22, 27:29> may be one which succeeds with the K number of first class read levels.

Among the first group memory blocks BLOCK<0:29> other than the first class memory blocks BLOCK<0:7, 10:17, 20:22, 27:29>, the classification-suspended memory block may be successful with the second class read level. At a time when the classification-suspended memory block becomes the second group memory block due to increase of the number of PE cycles thereof, the classification-suspended memory block may become the first class memory block.

Among the first group memory blocks BLOCK<0:29> other than the first class memory blocks BLOCK<0:7, 10:17, 20:22, 27:29>, the lower-level-classified memory blocks may fail with the second class read level.

Among the lower-level-classified memory blocks, the second class memory block BLOCK<8, 18, 23, 26> may be one having the hard decoding recovery success count value equal to or greater than the predetermined threshold for the second class memory block.

Among the lower-level-classified memory blocks other than the second class memory block BLOCK<8, 18, 23, 26>, the third class memory block BLOCK<9, 19, 24> may be one having the soft decoding recovery success count value equal to or greater than the predetermined threshold for the third class memory block.

The remaining lower-level-classified memory block BLOCK<25> other than the second class memory block BLOCK<8, 18, 23, 26> and the third class memory block BLOCK<9, 19, 24> may be the unavailable memory block.

After the classification, the controller 130 may differently set durability parameters for the respective memory blocks BLOCK<0:39> according to the classification (1305). In accordance with an embodiment of the present invention, the durability parameters for the respective memory blocks BLOCK<0:39> may include a read reclaim count reference number and a PE limit number.

In detail, the controller 130 may set the read reclaim count reference number and the PE limit number for the memory blocks BLOCK<0:39> such that the respective second class memory blocks BLOCK<8, 18, 23, 26> have a smaller read reclaim count reference number and the PE limit number than that of the first class memory blocks BLOCK<0:7, 10:17, 20:22, 27:29>.

Under an assumption that memory cells of the memory blocks BLOCK<0:39> are multi-level cell capable of storing two or more bits, a most significant bit (MSB) data may be read from the memory blocks BLOCK<0:39> according to a first read level and the other bit data may be read from the memory blocks BLOCK<0:39> according to two or more second read levels, each of which is higher than the first read level.

While reading the MSB data from the memory blocks BLOCK<0:39> according to the first read level, the controller 130 sets the read reclaim count reference number for the memory blocks BLOCK<0:39> such that the respective second class memory blocks BLOCK<8, 18, 23, 26> have smaller read reclaim count reference number than that of the first class memory blocks BLOCK<0:7, 10:17, 20:22, 27:29>.

While reading data other than the MSB data from the memory blocks BLOCK<0:39> according to the second read levels, the controller 130 sets the PE cycle limit number for the memory blocks BLOCK<0:39> such that the respective second class memory blocks BLOCK<8, 18, 23, 26> have smaller PE cycle limit number than that of the first class memory blocks BLOCK<0:7, 10:17, 20:22, 27:29>.

The reason for this may be that if an error correctable through hard decoding has been generated in a read operation process using the "set first read level", there is a good possibility that the error may be a read disturb error generated because too many read operations have been generated in a corresponding memory block is high. In contrast, the reason for this may be that if an error correctable through hard decoding has been generated in a read operation process using the "set second read levels", there is a good possibility that a corresponding memory block itself may have had relatively low durability when the nonvolatile memory device 150 was fabricated.

Furthermore, the controller 130 may set the read reclaim count reference number and the PE limit number for the memory blocks BLOCK<0:39> such that the respective third class memory block BLOCK<9, 19, 24> have smaller read reclaim count reference number and the PE limit number than that of the second class memory blocks BLOCK<8, 18, 23, 26>.

While reading the MSB data according to the first read level and data other than the MSB data according to the second read levels from the memory blocks BLOCK<0:39>, the controller 130 sets the read reclaim count reference number and the PE limit number for the memory blocks BLOCK<0:39> such that the respective third class memory block BLOCK<9, 19, 24> has less read reclaim count reference number and the PE limit number than that of the second class memory blocks BLOCK<8, 18, 23, 26>.

The reason for this may be that the memory blocks BLOCK<9, 19, 24> classified into the third class memory blocks have a good possibility that they themselves may have had relatively very low durability when the nonvolatile memory device 150 was fabricated regardless of whether an error correctable through soft decoding has occurred in a read operation process using the "set first read level" or whether an error correctable through soft decoding has occurred in a read operation process using the "set second read level."

Figure 6:
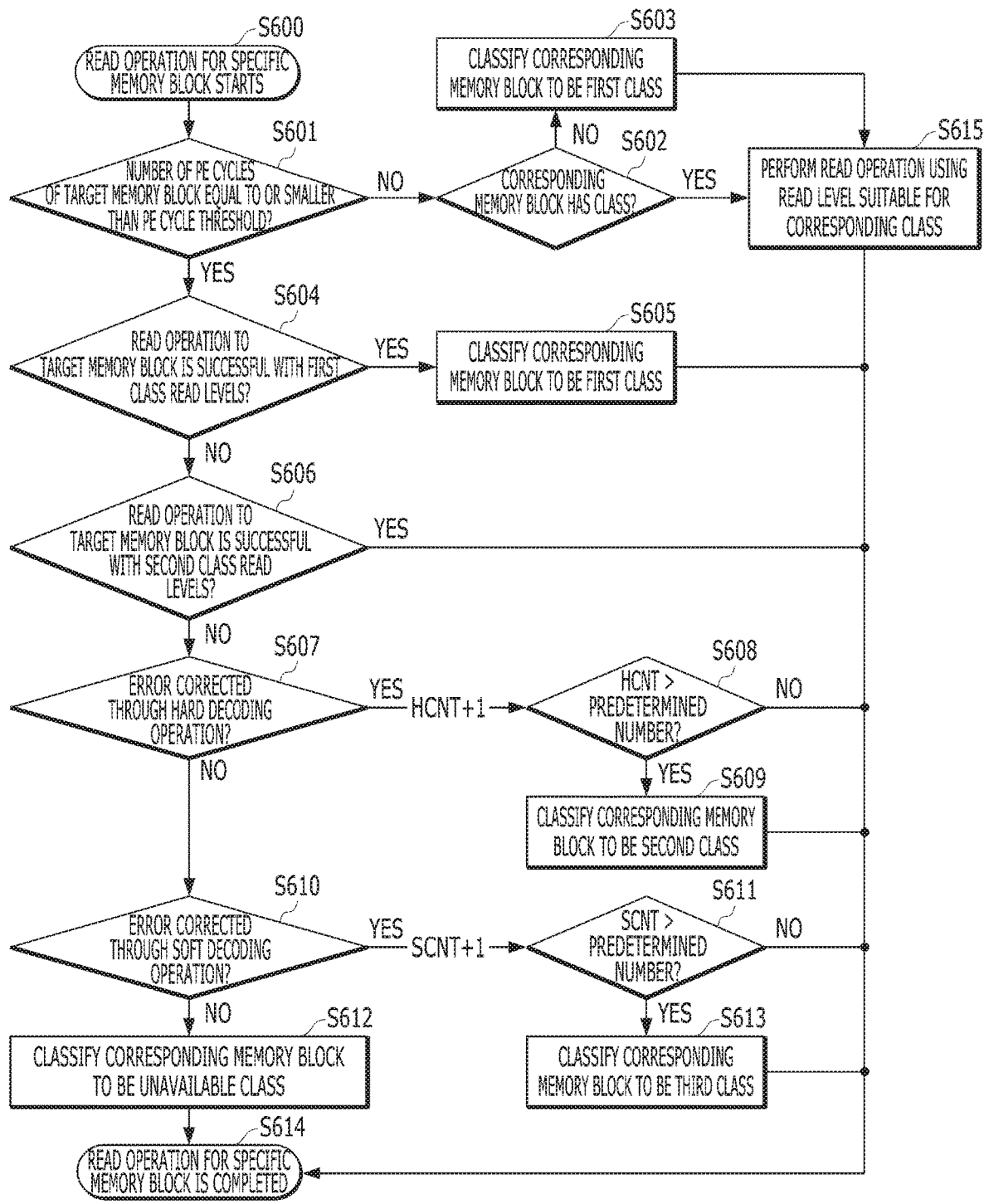
FIG. 6 is a flowchart illustrating an operation of the memory system shown in FIG. 5.

FIG. 6 is a flowchart illustrating an operation of the memory system 100 of FIG. 5.

Referring to FIGS. 5 and 6, when a read operation begins to a target memory block among the plurality of memory blocks BLOCK<0:39> included in the nonvolatile memory device 150 at step S600, the controller 130 checks whether the number of PE cycles of the target memory block is equal to or smaller than the PE cycle threshold at step S601.

When the number of PE cycles of the target memory block is equal to or smaller than the PE cycle threshold (YES at step S601), the target memory block is classified as the first group memory block.

When the target memory block is classified as the first group memory block, the controller 130 checks whether a read operation to the target memory block or the first group memory block is successful with the first class read levels at step S604.

When a read operation to the target memory block or the first group memory block is successful with the first class read levels (YES at step S604), the target memory block is classified as the first class memory block at step S605. Therefore, the read operation to the target memory block may end at step S614.

When a read operation to the target memory block or the first group memory block fails with the first class read levels (NO at step S604), the controller 130 may control checks a read operation to the target memory block is successful with the second class read levels at step S606.

When the read operation to the target memory block is successful with the second class read levels (YES at step S606), the controller 130 suspends classification for the target memory block and the target memory block may be the classification-suspended memory block, as described with reference to FIG. 5. Therefore, the read operation to the target memory block may end at step S614.

When a read operation to the target memory block fails with the second class read levels (NO at step S606), the target memory block may be the lower-level-classified memory block and the controller 130 checks whether the detected error of the data read from the target memory block is corrected through the hard decoding operation of the ECC unit 138 at step S607.

When the detected error of the data read from the target memory block is corrected through the hard decoding operation of the ECC unit 138 (YES at step S607), the controller 130 increases the hard decoding recovery success count value HCNT of the target memory block by one and checks whether the increased hard decoding recovery success count value HCNT exceeds the predetermined threshold for the second class memory block at step S608.

When the increased hard decoding recovery success count value HCNT does not exceed the predetermined threshold for the second class memory block (NO at step S608), the read operation to the target memory block may end at step S614. As described with reference to FIG. 5, the controller 130 classifies the target memory block or the lower-level-classified memory block as the second class memory block when the hard decoding recovery success count value of the lower-level-classified memory block reaches the predetermined threshold for the second class memory block in order to prevent a lower-level-classified memory block, which should be classified as the third class memory block or the unavailable memory block, from being classified as the second class memory block due to mere one or small number of success times of the hard decoding operation thereto.

When the increased hard decoding recovery success count value HCNT exceeds the predetermined threshold for the second class memory block (YES at step S608), the controller 130 classifies the target memory block as the second class memory block at step S609. Therefore, the read operation to the target memory block may end at step S614.

When the detected error of the data read from the target memory block is not corrected through the hard decoding operation of the ECC unit 138 (NO at step S607), the controller 130 checks whether the detected error of the data read from the target memory block is corrected through the soft decoding operation of the ECC unit 138 at step S610.

When the detected error of the data read from the target memory block is corrected through the soft decoding operation of the ECC unit 138 (YES at step S610), the controller 130 increases the soft decoding recovery success count value SCNT of the target memory block by one and checks whether the increased soft decoding recovery success count value SCNT exceeds the predetermined threshold for the third class memory block at step S611.

When the increased soft decoding recovery success count value SCNT does not exceed the predetermined threshold for the third class memory block (NO at step S611), the read operation to the target memory block may end at step S614. As described with reference to FIG. 5, the controller 130 classifies the target memory block or the lower-level-classified memory block as the third class memory block when the soft decoding recovery success count value of the lower-level-classified memory block reaches the predetermined threshold for the third class memory block in order to prevent a lower-level-classified memory block, which should be classified as the unavailable memory block, from being classified as the third class memory block due to mere one or small number of success times of the soft decoding operation thereto.

When the increased soft decoding recovery success count value SCNT exceeds the predetermined threshold for the third class memory block (YES at step S611), the controller 130 classifies the target memory block as the third class memory block at step S613. Therefore, the read operation to the target memory block may end at step S614.

When the detected error of the data read from the target memory block is not corrected through the soft decoding operation of the ECC unit 138 (NO at step S610), the controller 130 classifies the target memory block as the unavailable class memory block at step S612. Therefore, the read operation to the target memory block may end at step S614.

When the number of PE cycles of the target memory block is greater than the PE cycle threshold (NO at step S601), the controller 130 classifies the target memory block as the second group memory block.

Then, the controller 130 checks whether the target memory block is classified as one among the first to third and unavailable memory blocks during the previous read operation at step S602.

When the target memory block is classified as one among the first to third and unavailable memory blocks during the previous read operation (YES at step S602), the controller 130 performs a read operation using a read level suitable for the corresponding class at step S615). The read level suitable for the corresponding class may include the first and second class read level. The read level suitable for the corresponding class may further include the first and second read levels for reading the MSB data and the other bit data of the respective memory blocks BLOCK<0:39>. Then, the read operation to the target memory block may end at step S614.

When the target memory block is not classified as one among the first to third and unavailable memory blocks during the previous read operation (NO at step S602), the controller 130 classifies the target memory block as the first group memory block at step S603. Then, the controller 130 performs a read operation using a read level suitable for a corresponding class at step S615.

In this case, the read level for the target memory block classified as the first group memory block at step S603 may not be the first class read level. As described with reference to FIG. 5, the controller 130 classifies the classification-suspended memory block as the second group memory block as the number of PE cycles of the respective first group memory blocks becomes greater, and at this time the controller 130 may also classify the classification-suspended memory block as the first class memory block. Furthermore, a reason for this may be that the controller 130 may be precisely aware of a read level for the target memory block and has found a proper read level on which the read operation can be successful in a process of suspending a class for the target memory block. Then, the read operation to the target memory block may end at step S614.

FIGS. 7 to 15 are diagrams schematically illustrating application examples of the data processing system 100.

Figure 7:
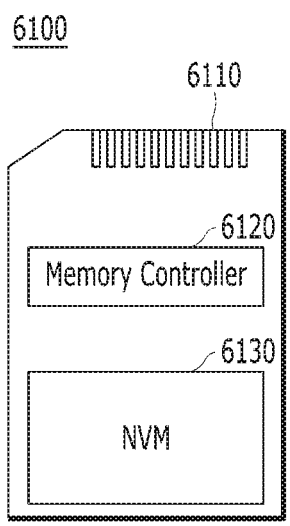
FIGS. 7 to 15 are diagrams schematically illustrating application examples of the data processing system shown in FIG. 1.

FIG. 7 is a diagram schematically illustrating another example of the data processing system including the memory system in accordance with the present embodiment.

FIG. 7 schematically illustrates a memory card system to which the memory system in accordance with an embodiment of the present invention is applied.

Referring to FIG. 7, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 8:
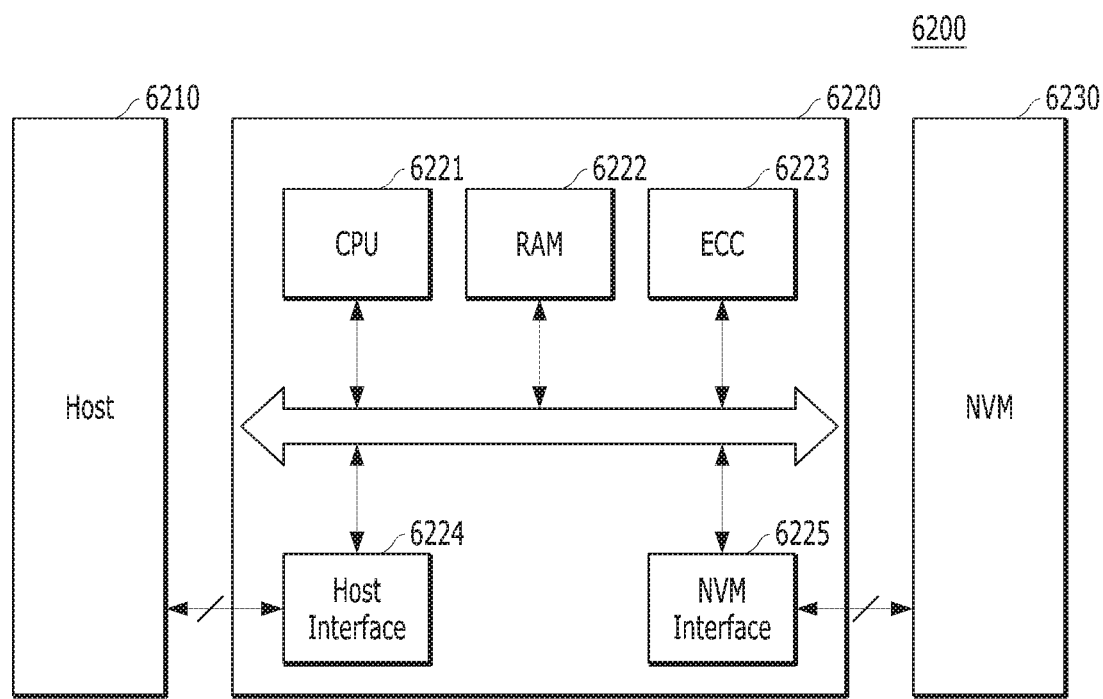

FIG. 8 is a diagram schematically illustrating another example of the data processing system including the memory system in accordance with the present embodiment.

Referring to FIG. 8, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 9:
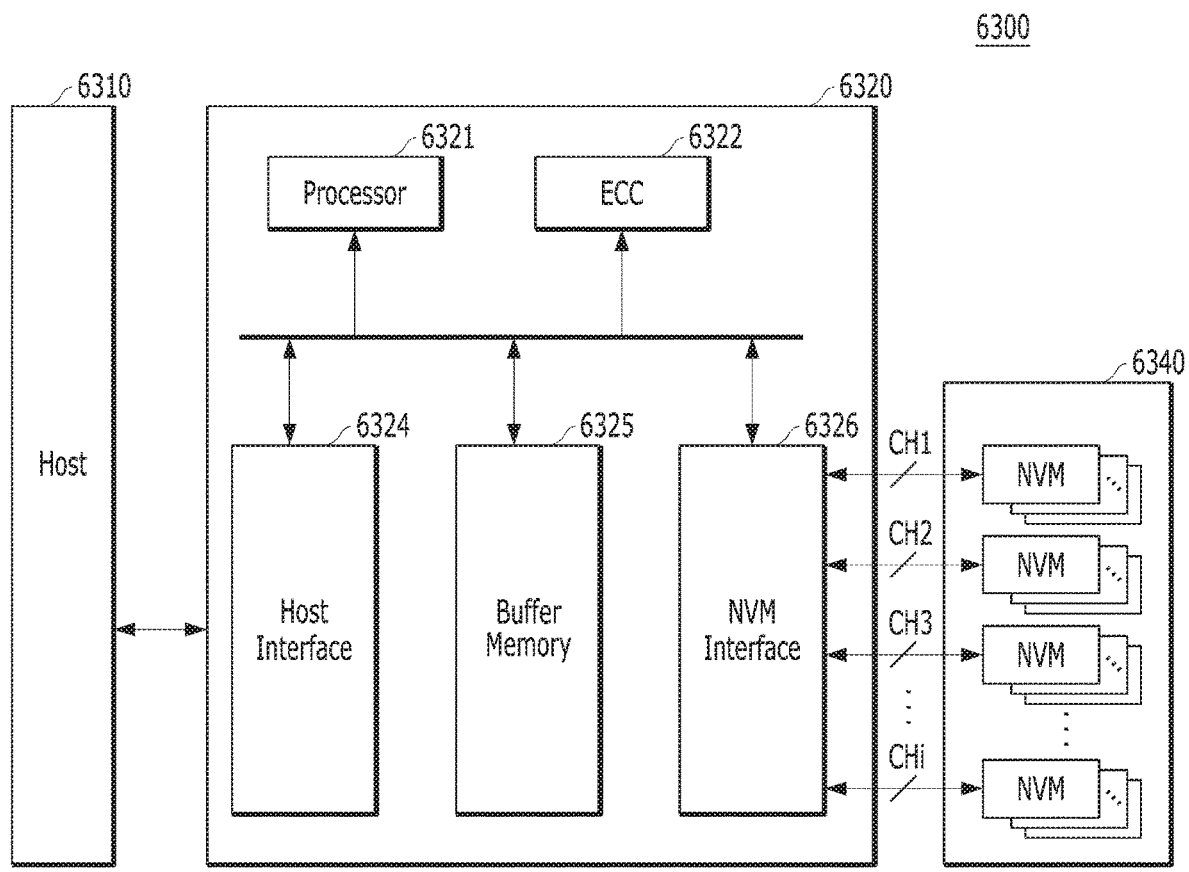

FIG. 9 is a diagram schematically illustrating another example of the data processing system including the memory system in accordance with the present embodiment. FIG. 9 schematically illustrates an SSD to which the memory system in accordance with the present embodiment is applied.

Referring to FIG. 9, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 8 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 10:
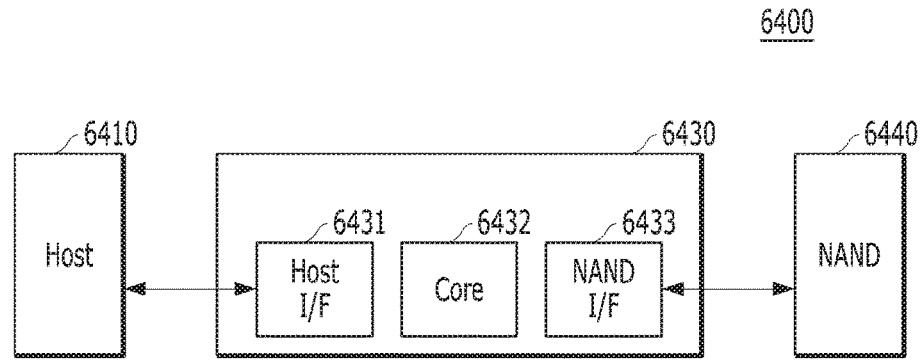

FIG. 10 is a diagram schematically illustrating another example of the data processing system including the memory system in accordance with the present embodiment. FIG. 10 schematically illustrates an embedded Multi-Media Card (eMMC) to which the memory system in accordance with the present embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 11 to 14 are diagrams schematically illustrating other examples of the data processing system including the memory system in accordance with the present embodiment. FIGS. 11 to 14 schematically illustrate UFS (Universal Flash Storage) systems to which the memory system in accordance with the present embodiment is applied.

Referring to FIGS. 11 to 14, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 8 to 10, and the UFS cards 6530, 6630, 6730 and 6830 may be embodied in the form of the memory card system 6100 described with reference to FIG. 7.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 11:
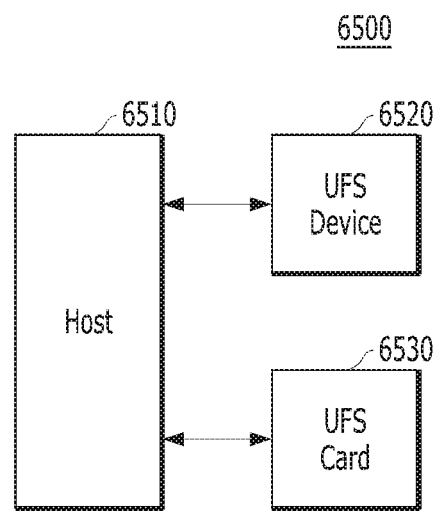

In the UFS system 6500 illustrated in FIG. 11, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 12:
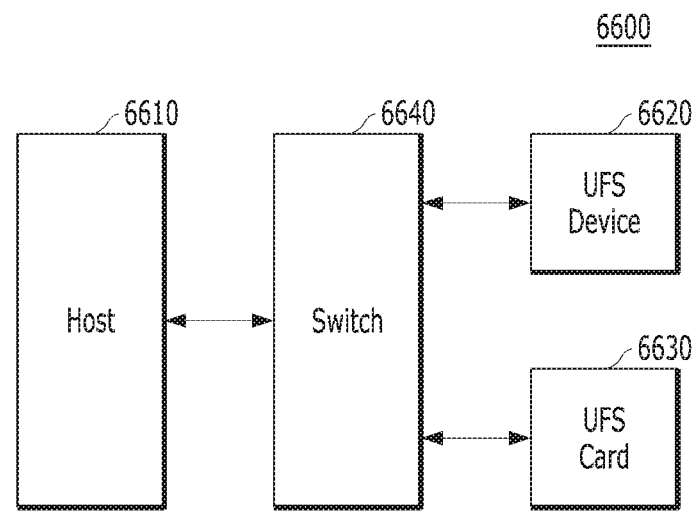

In the UFS system 6600 illustrated in FIG. 12, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 13:
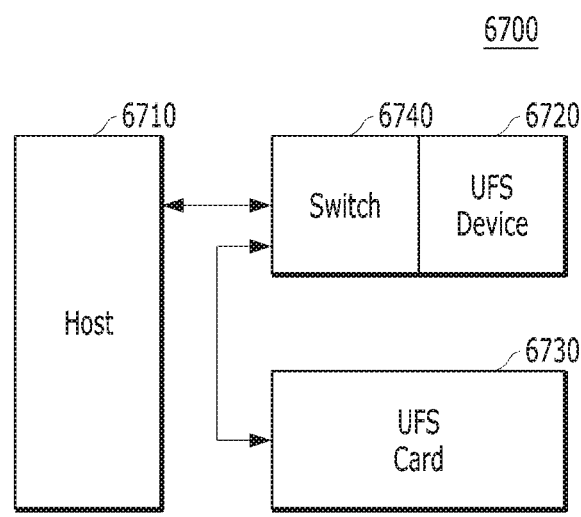

In the UFS system 6700 illustrated in FIG. 13, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 14:
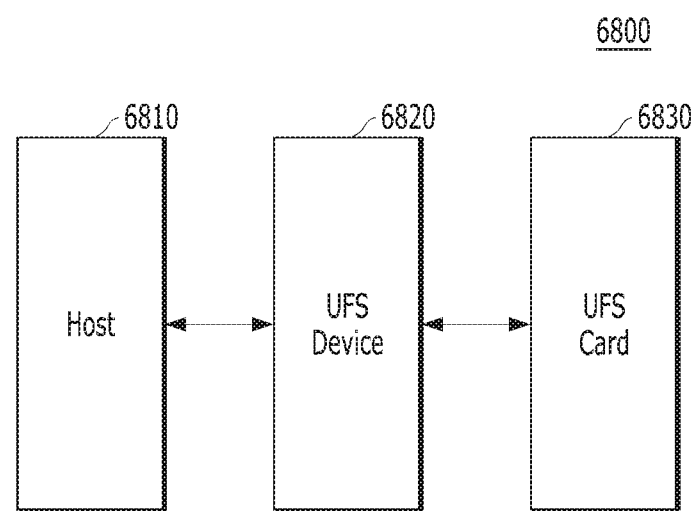

In the UFS system 6800 illustrated in FIG. 14, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 15:
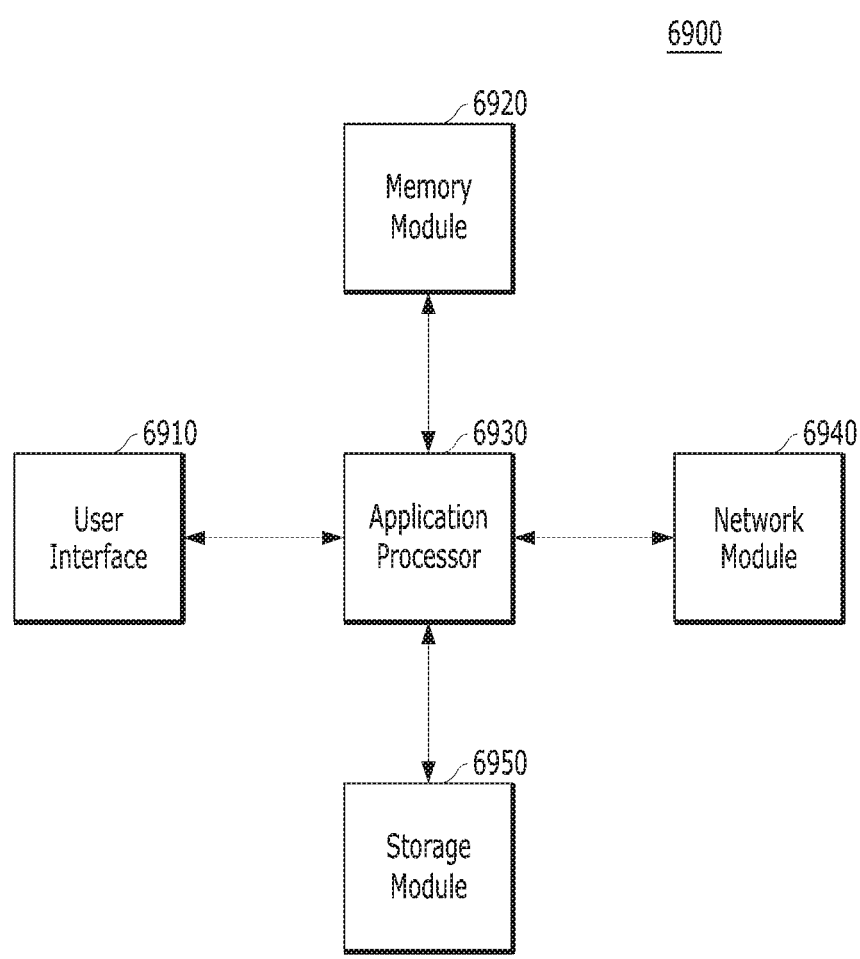

FIG. 15 is a diagram schematically illustrating another example of the data processing system including the memory system in accordance with an embodiment. FIG. 15 is a diagram schematically illustrating a user system to which the memory system in accordance with the present embodiment is applied.

Referring to FIG. 15, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

As described above, during a read operation to the respective memory blocks, the controller may differently set durability criteria for the respective memory blocks based on a read operation time, a read level class, error included in read data and an error occurrence class. Accordingly, there is an advantage in that the operation stability of the memory system can be significantly improved.

Although various embodiments have been described for illustrative purposes, it will be apparent to those skilled in the art that various changes and modifications may be made without departing from the spirit and scope of the invention as defined in the following claims.

What is claimed is:

1. A memory system, comprising:
a nonvolatile memory device comprising a plurality of memory blocks; and
a controller configured to:
check a read performance when performing a read operation on each of the memory blocks;
classify the memory blocks into various grades based on a result of the checking; and
differently set a durability parameter for each of the memory blocks based on a result of the classifying of the memory blocks.

2. The memory system of claim 1, wherein, among the memory blocks, the controller classifies, based on the checked read performance, a target memory block having a number of program/erase (PE) cycles equal to or smaller than a PE cycle threshold as a first group memory block while classifying, based on the checked read performance, the target memory block having a number of PE cycles greater than the PE cycle threshold as a second group memory block.

3. The memory system of claim 2,
wherein, among a plurality of the first group memory blocks, the controller further classifies, based on the checked read performance, a target memory block, a read operation to which successes with first grade read levels, as a first grade memory block of the various grades,
wherein the first grade read levels are K numbers of read levels among predetermined N read levels,
wherein N is a natural number greater than or equal to 2, K is a natural number greater than or equal to 1, and N is greater than K.

4. The memory system of claim 3,
wherein, among a plurality of the first group memory blocks, the controller further suspends classification of a target memory block, a read operation to which is successful with second grade read levels based on the checked read performance, among remaining memory blocks other than the first grade memory blocks,
wherein the second grade read levels are remaining read levels other than the first grade read levels among the predetermined N read levels, and
wherein, among previously classification-suspended memory blocks, the controller further classifies the second group memory block also as the first grade memory block.

5. The memory system of claim 4,
further comprising an ECC unit configured to perform an error-correction operation to a target memory block of the read operation to the respective memory blocks, and
wherein, among the first group memory blocks other than the first grade memory blocks and the classification-suspended memory blocks, the controller further classifies a target memory block as one of second and third grade memory blocks of the various grades and an unavailable memory block according to the read performance including whether the error-correction operation is performed to the target memory block.

6. The memory system of claim 5,
wherein the error-correction operation includes a hard decoding operation and a soft decoding operation, and
wherein, among the first group memory blocks other than the first grade memory blocks and the classification-suspended memory blocks, the controller classifies as the second grade memory block a target memory block, a success number of the hard decoding operations to which reaches a predetermined threshold for second grade memory block.

7. The memory system of claim 6,
wherein, among the first group memory blocks other than the first grade memory blocks, the classification-suspended memory blocks and the second grade memory blocks, the controller classifies as the third grade memory block a target memory block, a success number of the soft decoding operations to which reaches a predetermined threshold for third grade memory block, and classifies one or more respective remaining memory blocks as the unavailable memory block.

8. The memory system of claim 7,
wherein the durability parameter includes a read reclaim count reference number and a PE cycle limit number for the respective memory blocks,
wherein the controller sets the durability parameter such that the respective second grade memory blocks has one of the read reclaim count reference number and the PE cycle limit number less than that of the first grade memory blocks, and
wherein the controller sets the durability parameter such that the respective third grade memory blocks has both of the read reclaim count reference number and the PE cycle limit number less than those of the second grade memory blocks.

9. The memory system of claim 8,
wherein the respective memory blocks includes a memory cell configured to store two or more bits,
wherein the controller sets the durability parameter such that the respective second grade memory blocks has the read reclaim count reference number less than that of the first grade memory blocks during a read operation to the second memory blocks with a predetermined first read level, and
wherein the controller sets the durability parameter such that the respective second grade memory blocks has the PE cycle limit number less than that of the first grade memory blocks during a read operation to the second memory blocks with one or more predetermined second read levels higher than the predetermined first read level.

10. The memory system of claim 9, wherein the controller sets the durability parameter such that the respective third grade memory blocks has both of the read reclaim count reference number and the PE cycle limit number less than those of the second grade memory blocks during a read operation to the third grade memory blocks with the predetermined first and second read levels.

11. A memory system, comprising:
a nonvolatile memory device comprising a plurality of memory blocks; and
a controller configured to:
classify the memory blocks into various grades based on a read level and a result of error-correction operation checked when performing a read operation on each of the memory blocks; and
differently set a durability parameter for each of the memory blocks based on a result of the classifying of the memory blocks.

12. The memory system of claim 11, wherein, among the memory blocks, the controller groups a target memory block having a number of program/erase (PE) cycles equal to or smaller than a PE cycle threshold as a first group memory block while grouping the target memory block having a number of PE cycles greater than the PE cycle threshold as a second group memory block.

13. The memory system of claim 12,
wherein, among a plurality of the first group memory blocks, the controller classifies, based on the read level checked, a target memory block, a read operation to which successes with first grade read levels, as a first grade memory block of the various grades,
wherein the first grade read levels are K numbers of read levels among predetermined N read levels,
wherein N is a natural number greater than or equal to 2, K is a natural number greater than or equal to 1, and N is greater than K.

14. The memory system of claim 13,
wherein, among a plurality of the first group memory blocks, the controller further suspends classification of a target memory block, a read operation to which is successful with second grade read levels, among remaining memory blocks other than the first grade memory blocks,
wherein the second grade read levels are remaining read levels other than the first grade read levels among the predetermined N read levels, and
wherein, among previously classification-suspended memory blocks, the controller further groups the second group memory block also as the first grade memory block.

15. The memory system of claim 14,
further comprising an ECC unit configured to perform an error-correction operation to a target memory block of the read operation to the respective memory blocks, and
wherein, among the first group memory blocks other than the first grade memory blocks and the classification-suspended memory blocks, the controller further classifies a target memory block as one of second and third grade memory blocks of the various grades and an unavailable memory block according to whether the error-correction operation is performed to the target memory block.

16. The memory system of claim 15,
wherein the error-correction operation includes a hard decoding operation and a soft decoding operation, and
wherein, among the first group memory blocks other than the first grade memory blocks and the classification-suspended memory blocks, the controller classifies as the second grade memory block a target memory block, a success number of the hard decoding operations to which reaches a predetermined threshold for second grade memory block.

17. The memory system of claim 16,
wherein, among the first group memory blocks other than the first grade memory blocks, the classification-suspended memory blocks and the second grade memory blocks, the controller classifies as the third grade memory block a target memory block, a success number of the soft decoding operations to which reaches a predetermined threshold for third grade memory block, and classifies one or more respective remaining memory blocks as the unavailable memory block.

18. The memory system of claim 17,
wherein the durability parameter includes a read reclaim count reference number and a PE cycle limit number for the respective memory blocks,
wherein the controller sets the durability parameter such that the respective second grade memory blocks has one of the read reclaim count reference number and the PE cycle limit number less than that of the first grade memory blocks, and
wherein the controller sets the durability parameter such that the respective third grade memory blocks has both of the read reclaim count reference number and the PE cycle limit number less than those of the second grade memory blocks.

19. The memory system of claim 18,
wherein the respective memory blocks includes a memory cell configured to store two or more bits,
wherein the controller sets the durability parameter such that the respective second grade memory blocks has the read reclaim count reference number less than that of the first grade memory blocks during a read operation to the second memory blocks with a predetermined first read level, and
wherein the controller sets the durability parameter such that the respective second grade memory blocks has the PE cycle limit number less than that of the first grade memory blocks during a read operation to the second memory blocks with one or more predetermined second read levels higher than the predetermined first read level.

20. The memory system of claim 19, wherein the controller sets the durability parameter such that the respective third grade memory blocks has both of the read reclaim count reference number and the PE cycle limit number less than those of the second grade memory blocks during a read operation to the third grade memory blocks with the predetermined first and second read levels.

* * * * *